(12) United States Patent
Otsuka

(10) Patent No.: US 11,475,272 B2
(45) Date of Patent: Oct. 18, 2022

(54) NEURAL NETWORK CIRCUIT

(71) Applicant: DENSO CORPORATION, Kariya (JP)

(72) Inventor: Shigeki Otsuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 636 days.

(21) Appl. No.: 16/562,534

(22) Filed: Sep. 6, 2019

(65) Prior Publication Data
US 2019/0392290 A1    Dec. 26, 2019

Related U.S. Application Data

(63) Continuation of application No. PCT/JP2018/002286, filed on Jan. 25, 2018.

(30) Foreign Application Priority Data

Mar. 24, 2017 (JP) .............................. JP2017-059136

(51) Int. Cl.
*G06N 3/063* (2006.01)
*G06N 3/06* (2006.01)
(Continued)

(52) U.S. Cl.
CPC ............. *G06N 3/04* (2013.01); *G06F 7/5443* (2013.01); *G11C 13/0038* (2013.01); *G11C 13/004* (2013.01); *H03F 3/45* (2013.01)

(58) Field of Classification Search
CPC ..... G06N 3/04; G06F 7/5443; G11C 13/0038; G11C 13/004; H03F 3/45
(Continued)

(56) References Cited

U.S. PATENT DOCUMENTS 5,538,915 A    6/1996  Fu
5,602,965 A    2/1997  Fu
(Continued)

FOREIGN PATENT DOCUMENTS

CN    203909497 U    * 10/2014
CN    104134383 A    * 11/2014
(Continued)

OTHER PUBLICATIONS

Liu, Xiaoxiao et al. "A Heterogeneous Computing System with Memristor-Based Neuromorphic Accelerators" High Performance Extreme Computing Conference, 2014 IEEE.
Wei, Z. et al. "Demonstration of High-density ReRAM Ensuring 10-year Retention at 85° C. Based on a Newly Developed Reliability Model" IEDM 2011.
(Continued)

*Primary Examiner* — Ly D Pham
(74) *Attorney, Agent, or Firm* — Posz Law Group, PLC

(57) ABSTRACT

A neural network circuit includes a memory device in which memristors being variable resistance elements are connected in a matrix and serve as memory elements of the memory device. The neural network circuit further includes a voltage application device arranged to apply a bias voltage to the memory device and current-voltage (I-V) conversion amplification circuits arranged to convert currents flowing via the memory elements into voltages and output the voltage. A feedback resistor of a respective I-V conversion amplification circuit includes a memristor. The feedback resistor of a respective I-V conversion amplification circuit and the memory elements acting as an input resistor of the I-V conversion amplification circuit are connected to align a polarity direction of the memristor of the feedback resistor and polarity directions of the memristors of the memory elements acting as the input resistor.

3 Claims, 11 Drawing Sheets

(51) Int. Cl.
  *G11C 13/00* (2006.01)
  *G11C 11/54* (2006.01)
  *G06N 3/04* (2006.01)
  *G06F 7/544* (2006.01)
  *H03F 3/45* (2006.01)

(58) Field of Classification Search
  USPC .......................................................... 706/36
  See application file for complete search history.

(56) References Cited

U.S. PATENT DOCUMENTS

| | | |
|---|---|---|
| 5,615,287 A | 3/1997 | Fu |
| 5,703,965 A | 12/1997 | Fu |
| 5,754,697 A | 5/1998 | Fu |
| 8,310,865 B2 | 11/2012 | Tsukada |
| 2013/0039118 A1 | 2/2013 | Tsukada |
| 2017/0316827 A1 | 11/2017 | Ge et al. |
| 2019/0147330 A1* | 5/2019 | Otsuka .................... G11C 11/54 706/29 |

FOREIGN PATENT DOCUMENTS

| | | | |
|---|---|---|---|
| CN | 204102401 U | * | 1/2015 |
| JP | 2015-115083 A | | 6/2015 |

OTHER PUBLICATIONS

Bayat, F. Merrikh et al. "Advancing Memristive Analog Neuromorphic Networks : Increasing Complexity, and Coping with Imperfect Hardware Components" 2016.

Bayat, F. Merrikh et al. "Phenomenological Modeling of Memristive Devices" Applied Physics A, vol. 118, pp. 770-786, 2015.

* cited by examiner $$G^+(T) = G_{BIAS}(T) + G(T)/2$$

$$G^-(T) = G_{BIAS}(T) - G(T)/2$$

$$V_{OUT} = G \frac{A}{G_M(T)} \Sigma V_{IN} \left( G^+(T) - G^-(T) \right)$$

NEURAL NETWORK CIRCUIT

CROSS-REFERENCE TO RELATED APPLICATIONS

The present application is a continuation application of International Patent Application No. PCT/JP2018/002286 filed on Jan. 25, 2018, which designated the U.S. and claims the benefit of priority from Japanese Patent Application No. 2017-59136 filed on Mar. 24, 2017. The entire disclosures of all of the above applications are incorporated herein by reference.

TECHNICAL FIELD

The present disclosure relates to a neural network circuit including a memory device in which memristors serving as memory elements are connected in a matrix.

BACKGROUND

Currently, studies are ongoing to construct a neural network circuit that uses memristors.

SUMMARY

The present disclosure provides a neural network circuit capable of appropriately correcting temperature characteristics of memristors constituting memory elements.

In an aspect of the present disclosure, a neural network circuit comprises: a memory device including memristors being variable resistance elements connected in a matrix, wherein the memristors serve as memory elements of the memory device; a voltage application device arranged to apply a bias voltage to the memory device; and a plurality of current-voltage (I-V) conversion amplification circuits arranged to convert currents flowing via the memory elements into voltages and output the voltages. A feedback resistor of each I-V conversion amplification circuit includes a memristor. A polarity direction of the memristor of the feedback resistor of the I-V conversion amplification circuit is aligned with polarity directions of the memristors of the memory elements acting as an input resistor of the I-V conversion amplification circuit.

BRIEF DESCRIPTION OF THE DRAWINGS

Objects, features and advantages of the present disclosure will become more apparent from the following detailed description made with reference to the accompanying drawings. In the drawings.

DETAILED DESCRIPTION

Figure 15:
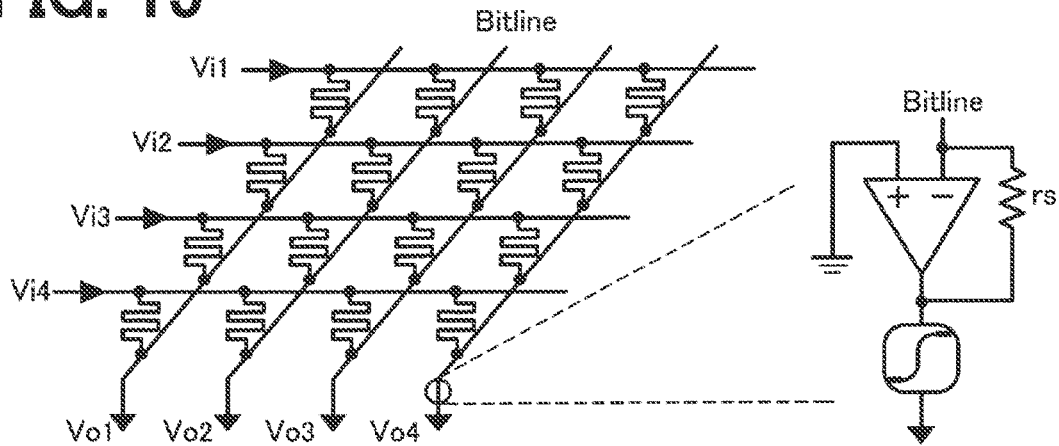
FIG. 15 is a circuit diagram illustrating a neural network circuit including memristors arranged in a matrix.

Some neural network circuits use memristors as synapses. The memristor is a non-volatile two-terminal element of which the conductance value is variable. In such a neural network circuit, the memristors are arranged in a matrix and voltages are applied to the memristors to generate currents, as shown in FIG. 15. The composite current is converted into a voltage by a transimpedance amplifier and is output as a voltage value after its waveform is shaped by an activation function. In the neural network circuit, the memristors act as synapses and the transimpedance amplifiers act as neurons. The transimpedance amplifier performs, by an analog operation, a multiply-accumulate operation to the conductance values of the memristors and the applied voltages.

Figure 16:
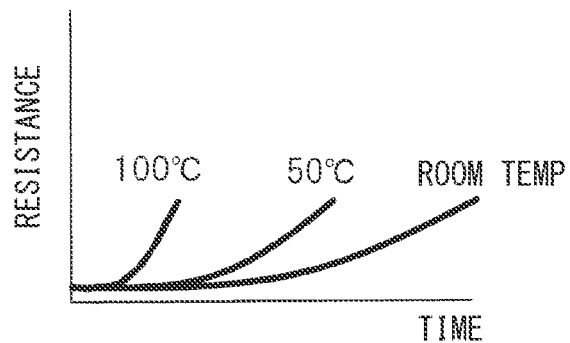
FIG. 16 is a diagram illustrating time dependency of temperature characteristics of a memristor.
Figure 17:
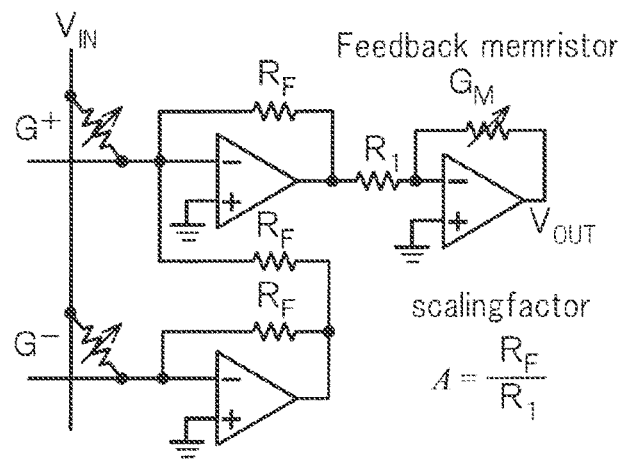
FIG. 17 is a diagram illustrating a circuit in which a memristor is used as a feedback resistor of an amplifier.

The temperature characteristics of the memristor in the neural network circuit are correctable by multiplying the input signal Vi by the temperature coefficient of the memristor. However, the temperature characteristics are time dependent in cases of retention characteristics as shown in FIG. 16. It is thus difficult to reduce the retention characteristics by the above-described method. FIG. 17 illustrates a configuration in which a memristor is used as a feedback resistor of an amplifier to take measures against the temperature characteristics and its time dependency.

Figure 18:
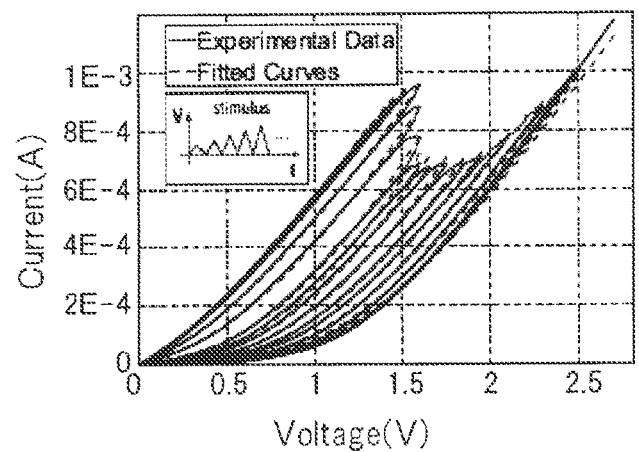
FIG. 18 is a diagram illustrating DC characteristics of a memristor.
Figure 19:
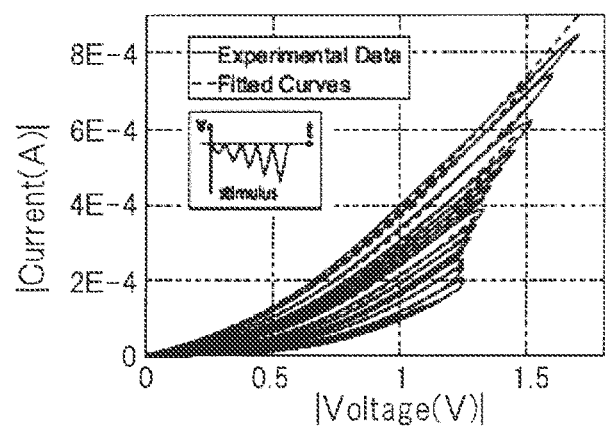
FIG. 19 is a diagram illustrating DC characteristics of the memristor when the input voltage polarity is revered as compared with that of FIG. 18.

However, as shown in FIGS. 18 and 19, because the memristor has such direct current (DC) characteristics that the resistance value varies depending on input voltage polarity, it may be necessary to change the correction value according to the input voltage polarity. In the case of multiple inputs shown in FIG. 17, it is difficult to settle whether the output VOUT of an error amplifier shows a positive polarity or a negative polarity.

An object of the present disclosure is to provide a neural network circuit capable of appropriately correcting temperature characteristics of memristors constituting memory elements.

In an aspect of the present disclosure, a neural network circuit comprises: a memory device including memristors being variable resistance elements connected in a matrix, wherein the memristors serve as memory elements of the memory device; a voltage application device arranged to apply a bias voltage to the memory device; and a plurality of current-voltage (I-V) conversion amplification circuits arranged to convert currents flowing via the memory elements into voltages and output the voltages. A feedback resistor of a respective I-V conversion amplification circuit includes a memristor. The feedback resistor of the I-V conversion amplification circuit and the memory elements acting as an input resistor of the I-V conversion amplification circuit are connected to align a polarity direction of the memristor of the feedback resistor and polarity directions of the memristors of the memory elements acting as the input resistor.

With this configuration, the memory elements and the feedback resistors of the I-V conversion amplifier circuits can have the same temperature characteristics. This makes it possible to uniform the polarity of electric current to these components. It is therefore possible to appropriately correct the temperature characteristics of the memory elements by the I-V conversion amplifier circuit.

Embodiments will be described below. Between the embodiments, like references are used to refer to like parts to avoid redundant description.

First Embodiment

Figure 1:
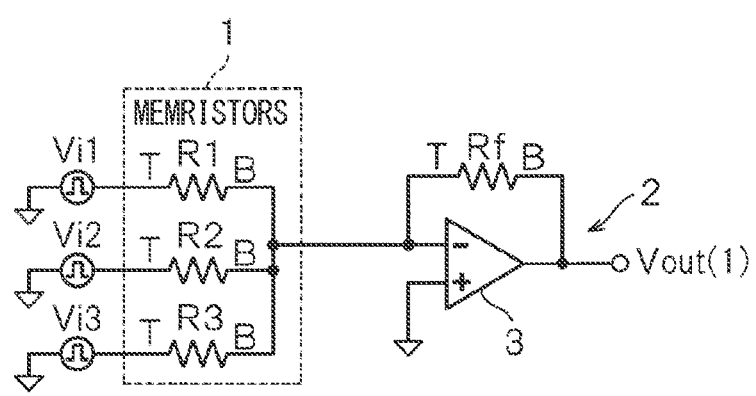
FIG. 1 is a circuit diagram illustrating how memristors of a memory device are connected to a sense amplifier in a first embodiment.

As shown in FIG. 1, a memory device 1 of a neural network circuit includes memory elements R1, R2, and R3 being memristors. It is noted that although only three memory elements are illustrated in FIG. 1 for simplification, an actual neural network circuit may include more memory elements. Variable voltage sources Vi1, Vi2, and Vi3 are connected to one ends of the memory elements R1, R2, and R3, respectively. The other ends of the memory elements R1, R2 and R3 are commonly connected to an inverting input terminal of an operational amplifier 3 which is an input terminal of a sense amplifier 2. Between the inverting input terminal and an output terminal of the operational amplifier 3, a feedback resistor Rf being a memristor is connected. A noninverting input terminal of the operational amplifier 3 is connected to ground. The sense amplifier 2 corresponds to a current-to-voltage (I-V) conversion amplifier circuit. The voltage sources Vi1, Vi2, and Vi3 are examples of a voltage application device arranged to apply a bias voltage to the memory device 1.

The memristor has a top electrode T, a bottom electrode B, and multiple layers having different compositions between the top electrode T and the bottom electrode B. The memristor has polarity as device polarity. In the present embodiment, as shown in FIG. 1, the top electrodes T of the memory elements R1, R2 and R3 are connected to the variable voltage sources Vi1, Vi2, and Vi3. The bottom electrodes B of the memory elements R1, R2 and R3 are connected to the inverting input terminal of the operational amplifier 3. That is, the memory elements R1, R2 and R3 are arranged so that their polarities are aligned with each other. Furthermore, the feedback resistor Rf is connected so that the polarity direction of the feedback resistor Rf is aligned with the aligned polarity directions of the memory elements R1 to R3. That is, the top electrode T of the feedback resistor Rf is connected to the inverting input terminal of the operational amplifier 3 and the bottom electrodes B of the memory elements R1, R2 and R3. The bottom electrode B of the feedback resistor Rf is connected to the output terminal of the operational amplifier 3. In the case shown in FIG. 1, the output voltage Vout of the sense amplifier 2 is given as $$Vout=-(Vi1/R1+Vi2/R2+Vi3/R3)\times Rf.$$

The sense amplifier 2 thus performs a multiply-accumulation operation.

Figure 2:
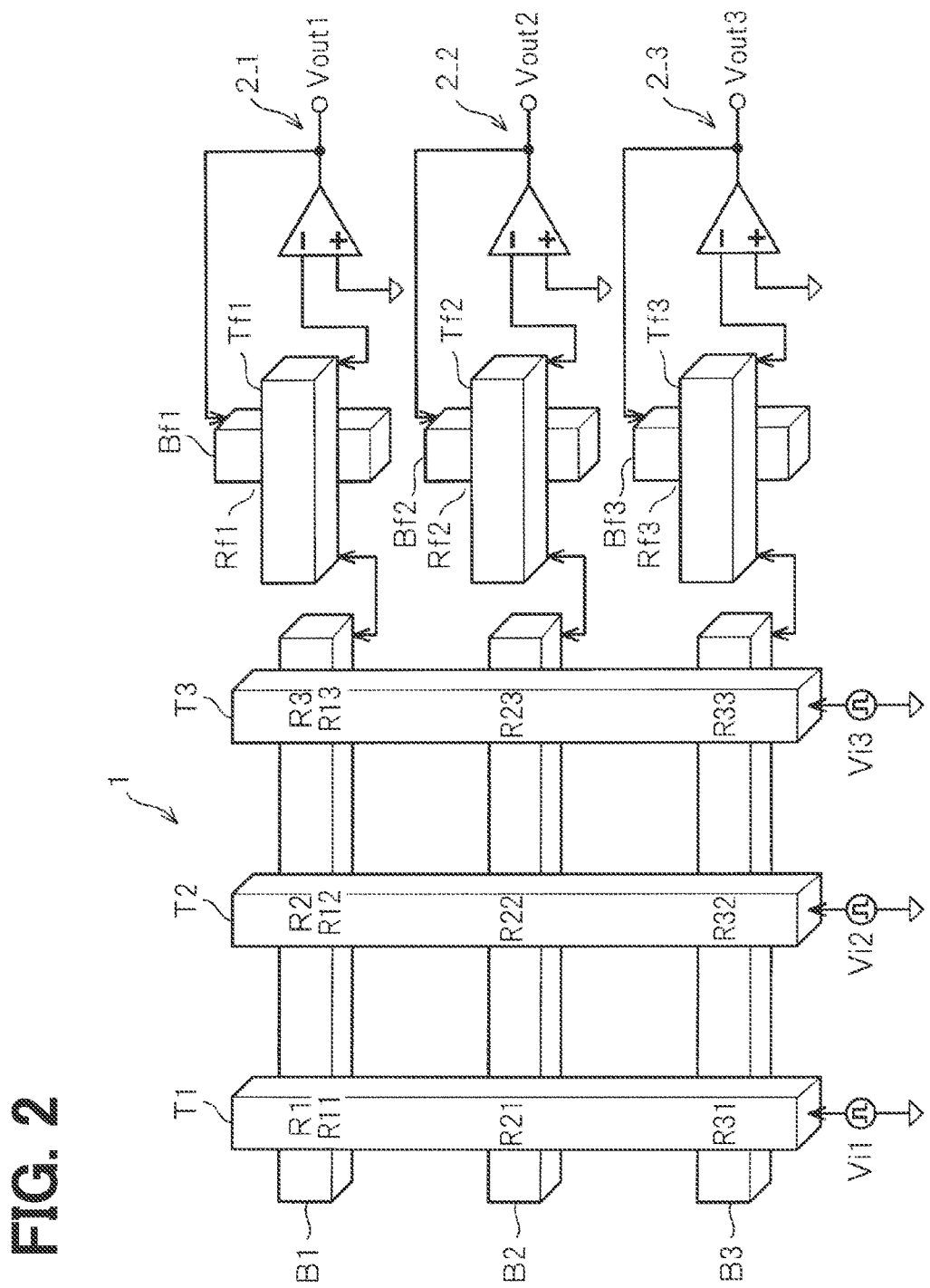
FIG. 2 is a diagram illustrating a concrete structure of a circuit show in FIG. 1.

FIG. 2 illustrates the memory device 1 in which the memory elements being memristors are connected in a 3×3 matrix. The top electrodes T1, T2, T3 are arranged in a column direction. The bottom electrodes B1, B2, B3 are arranged in a row direction. The memory elements R11, R12, R13, R21, R22, R23, R31, R32 and R33 are formed at intersections of the top electrodes T1, T2, T3 and the bottom electrode B1, B2, B3, thereby constituting so-called a crossbar. The memory elements R1 to R3 shown in FIG. 1 correspond to the memory elements R12 to R13 at the intersections of the top electrodes T1, T2, T3 and the bottom electrode B1 in FIG. 2. Memory elements R21 to R23 are formed at the intersections between the top electrodes T1, T2, T3 and the bottom electrode B2. Memory elements R31 to R33 are formed at the intersections between the top electrodes T1, T2, T3 and the bottom electrode B3.

The sense amplifier 2_1 is arranged corresponding to the memory elements R1 to R3 (R11 to R13) in a first column. A sense amplifier 2_2 is arranged corresponding to the memory elements R21 to R23 in a second column. A sense amplifier 2_3 is arranged corresponding to the memory elements R31 to R33 in a third column. The sense amplifier 2 shown in FIG. 1 corresponds to the amplifier 2_1 in FIG. 2. The top electrodes Tf1, Tf2, and Tf3 of the feedback resistors Rf1, Rf2, and Rf3 of the sense amplifiers 2_1, 2_2, and 2_3, respectively, are connected to the corresponding bottom electrodes B1, B2, and B3 of the memory device 1.

The bottom electrodes Bf1, Bf2, and Bf3 of the feedback resistors Rf1, Rf2, and Rf3 are arranged so as to perpendicularly intersect with the corresponding top electrodes Tf1, Tf2, and Tf3 of the feedback resistors Rf1, Rf2, and Rf3. The top electrodes T and the bottom electors B of the feedback resistors Rf are arranged in such a way that the top electrodes T and the bottom electors B of the feedback resistors Rf are rotated by 90 degrees with respect to the top electrodes T and the bottom electors B of the memory elements R in the memory device 1.

In the present embodiment, the feedback resistor Rf of the sense amplifier 2 and the memory elements R of the memory device 1 are the memristors having the same temperature characteristics. Because of this, the temperature characteristics are correctable at the output of the sense amplifier 2. Further, even when the temperature characteristics of the memristors are changed with time, these are correctable. Furthermore, because the memory elements R and the feedback resistor Rf are connected to align the polarity directions of the memristors of the feedback resistor R and the memory elements R, input-voltage-polarity-dependent non-linear characteristics are correctable. Furthermore, because the top electrodes T and the bottom electors B of the feedback resistors Rf are arranged so as to be rotated by 90 degrees with respect to the top electrodes T and the bottom electors B of the memory elements R in the memory device 1 as shown in FIG. 2, the top electrodes T of the feedback resistors Rf are usable as a wiring layer, enabling efficient wiring.

It should be noted that the terminal directions of all of the memristors shown in FIG. 1 and FIG. 2 are examples and the terminal directions of all of the memristors may be reversed with respect to those shown in FIG. 1 and FIG. 2.

Second Embodiment

Figure 3:
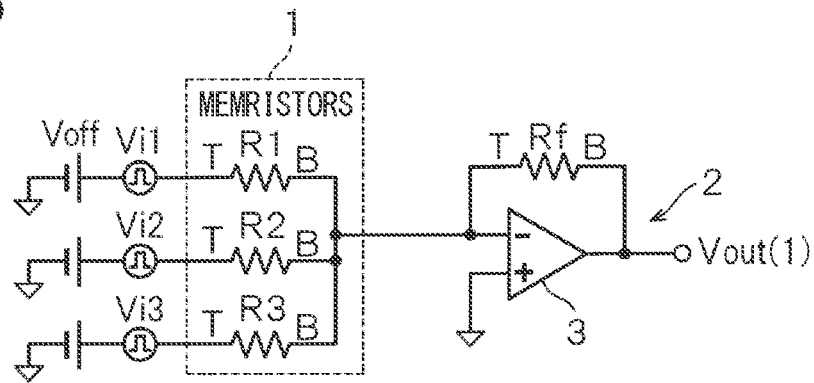
FIG. 3 is a circuit diagram illustrating how a memory device is connected to a feedback resistor in a second embodiment.
Figure 4:
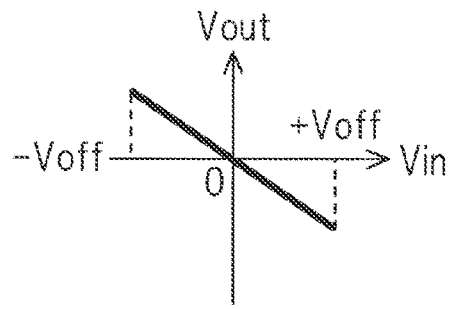
FIG. 4 is a diagram illustrating a region in which an output voltage of a sense amplifier varies when no offset voltage is given.
Figure 5:
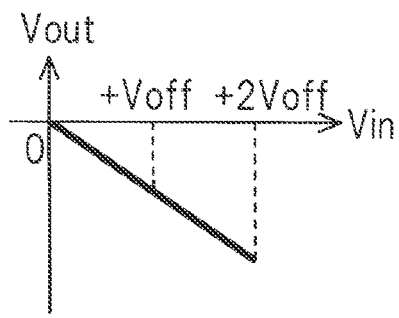
FIG. 5 is a diagram illustrating a region in which an output voltage of a sense amplifier varies when an offset voltage is given.

As shown in FIG. 3, in the second embodiment, an offset voltage source Voff is inserted between a respective voltage source Vi1, Vi2, Vi3 and the ground. The offset voltage Voff is applied to a respective memory element R1 in addition to the bias voltage of a respective voltage source Vi1, Vi2, Vi3 so that a region in which the output voltage Vout of the sense amplifier 2 is variable is set to only a negative polarity region as shown in FIG. 5. In other words, the bias voltage of the respective voltage source Vi1, Vi2, Vi3 is provided with the offset voltage Voff to match an operating polarity of the feedback resistor Rf of the sense amplifier 2 with an operating polarity of the memory elements R1, R2 and R3 acting as an input resistor of the sense amplifier 2. It is noted that when the offset voltage Voff is absent, a region in which the output voltage Vout of the sense amplifier 2 is variable may cover both a negative polarity region and a positive polarity region, as shown in FIG. 4.

In the second embodiment, the setting is made to cause the output voltage Vout of the sense amplifier 2 to be within only a negative polarity region. Thus, the temperature characteristic change that may occur due to the polarity change is avoidable. This makes it possible to appropriately correct the temperature characteristics. Note that the setting may be made to cause the output voltage Vout of the sense amplifier 2 to be within only a positive polarity region instead of the positive polarity region.

Third Embodiment

Figure 6:
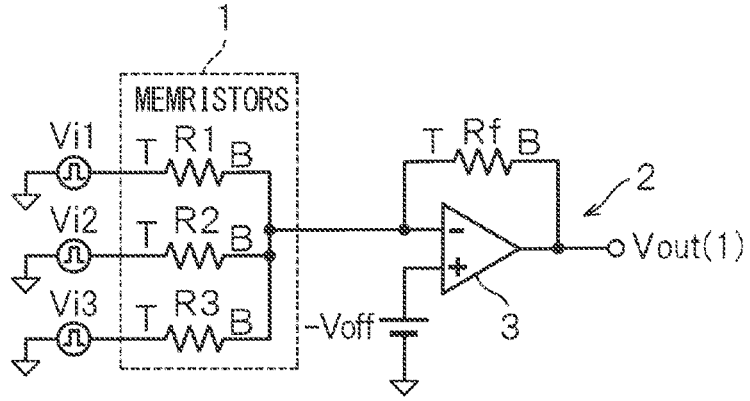
FIG. 6 is a circuit diagram illustrating how a memory device is connected to a feedback resistor in a third embodiment.
Figure 7:
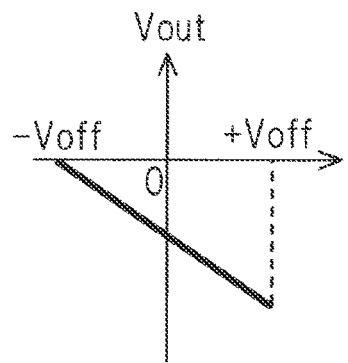
FIG. 7 is a diagram illustrating a region in which an output voltage of a sense amplifier varies when an offset voltage is given in the third embodiment.

A third embodiment is a modification of the second embodiment. In the third embodiment, as shown in FIG. 6, a voltage source −Voff for providing the offset voltage is inserted between the non-inverting input terminal of the operational amplifier 3 and the ground. Specifically, a reference voltage of the sense amplifier 2 is provided with the offset voltage. With this configuration, it is possible that the output voltage Vout of the sense amplifier 2 is within the negative polarity region as shown in FIG. 7 and that the polarity of the bias voltage applied to the feedback resistor Rf is always the same as the polarity of bias voltages applied to the memory elements R.

Fourth Embodiment

Figure 8:
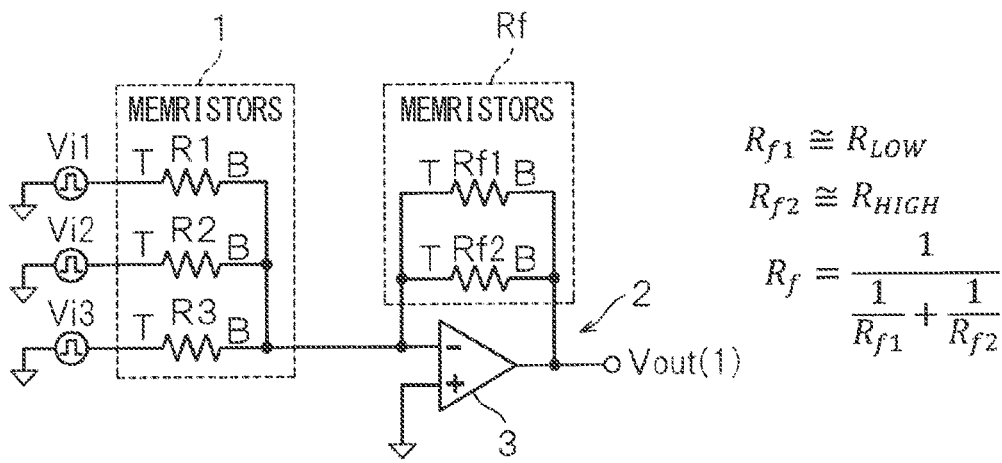
FIG. 8 is a circuit diagram illustrating how a memory device is connected to a feedback resistor in a fourth embodiment.
Figure 9:
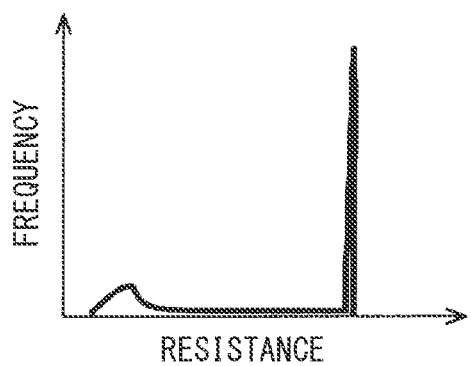
FIG. 9 is a diagram illustrating frequency distribution of resistance values set to respective memory elements of the memory device.

In the fourth embodiment, as shown in FIG. 8, the feedback resistor Rf connected to the operational amplifier 3 in the sense amplifier 2 is a parallel circuit of resistance elements Rf1 and Rf2. The resistance elements Rf1 and Rf2, respectively, are memristors. An idea behind the fourth embodiment is as follows. A large number of memory elements R may be used in the memory device 1 in a practical neural network circuit. When obtaining the frequency distribution of the resistance values of these memory elements R, most of the memory elements R are set to high resistance values while the number of memory elements R set to low resistance values are small, as shown in FIG. 9.

In view of this, the feedback resistor Rf in the fourth embodiment is combination of: the resistance element Rf1 having a low resistance Rlow that has a large influence on a gain of the sense amplifier 4; and the resistance element Rf2 having a high resistance Rhigh that corresponds to the highest frequency in the frequency distribution of the resistance values of the memory elements R. In other words, the feedback resistor Rf has a parallel composite resistance of a first resistance and a second resistance that, respectively, correspond to a high resistance memristor and a low resistance memristor extracted from frequency distribution of resistance values set to respective memory elements R of the memory device 1. Accordingly, the temperature characteristics of the feedback resistor Rf are approximated to those of the memory device 1. The fourth embodiment can correct the temperature characteristics in accordance with actual situations more properly.

Fifth Embodiment

Figure 11:
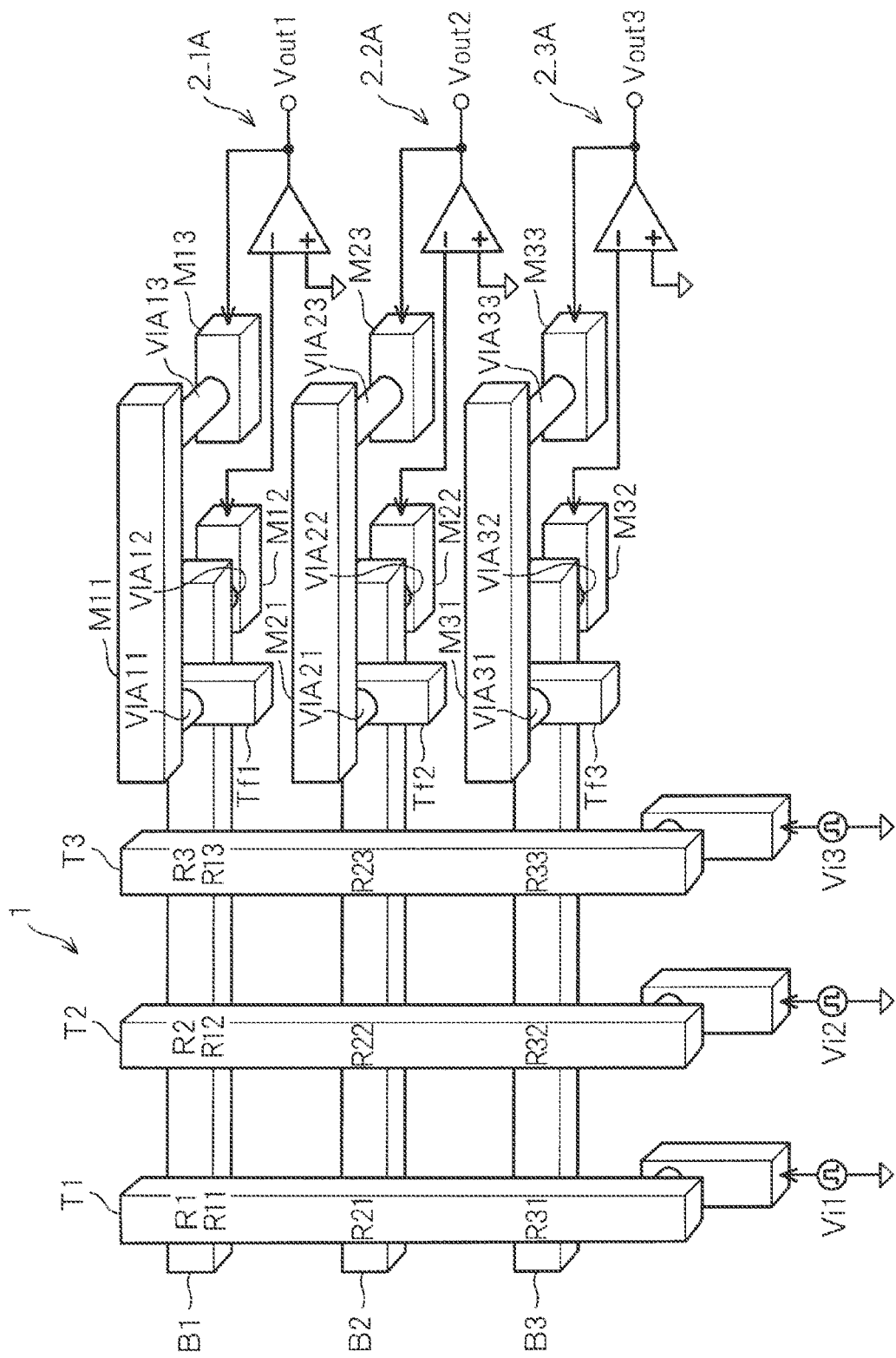
FIG. 11 is a diagram illustrating a wiring connection between a memory device and a feedback resistor in a comparative example.
Figure 12:
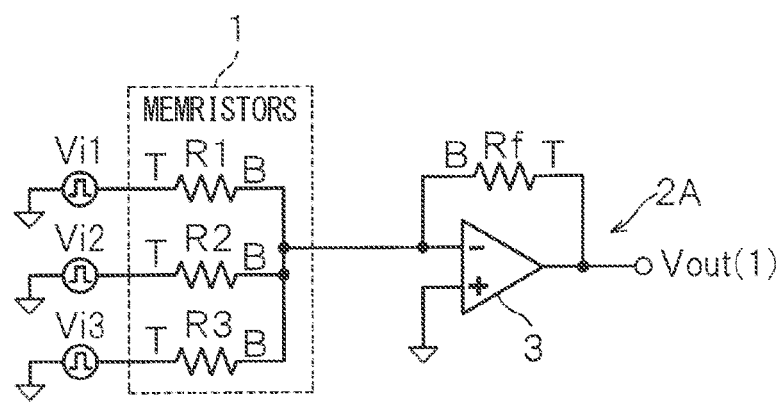
FIG. 12 is a circuit diagram illustrating a memory device and a feedback resistor.

The fifth embodiment employs a specific wiring arrangement. FIG. 11 illustrates a structure of comparative example in which priority is given to highest density element arrangement. A memory device 1 in FIG. 11 does not have an individual selection element, and memory elements R are formed by self-alignment at the intersections of top electrodes T and bottom electrodes B. In FIG. 11, the bottom electrodes B1 to B3 of the memory device 1 are also used as the bottom electrodes of the feedback resistors of the corresponding sense amplifiers 2_1A to 2_3A. Specifically, as shown in FIG. 12, a polarity direction of a feedback resistor Rf is a direction from the bottom electrode B to the top electrode T and is opposite to those of the memory elements R1 to R3.

Bottom electrodes B1, B2, B3, respectively, are connected to the inverting input terminals of the operational amplifiers 3 through vias VIA12, VIA22, VIA 32 and metal wirings M12, M22, M32. Top electrodes Tf1, Tf2, Tf3 of the feedback resistors Rf, respectively, are connected to output terminals of the operational amplifiers 3 through vias VIA11, VIA21, VIA 31, metal wirings M11, M21, M31, vias VIA13, VIA23, VIA 33 and metal wirings M13, M23, M33. The structure in FIG. 11 requires one additional metal wiring layer above the top electrodes Tf1, Tf2, Tf3 and this increases manufacturing costs.

Figure 10:
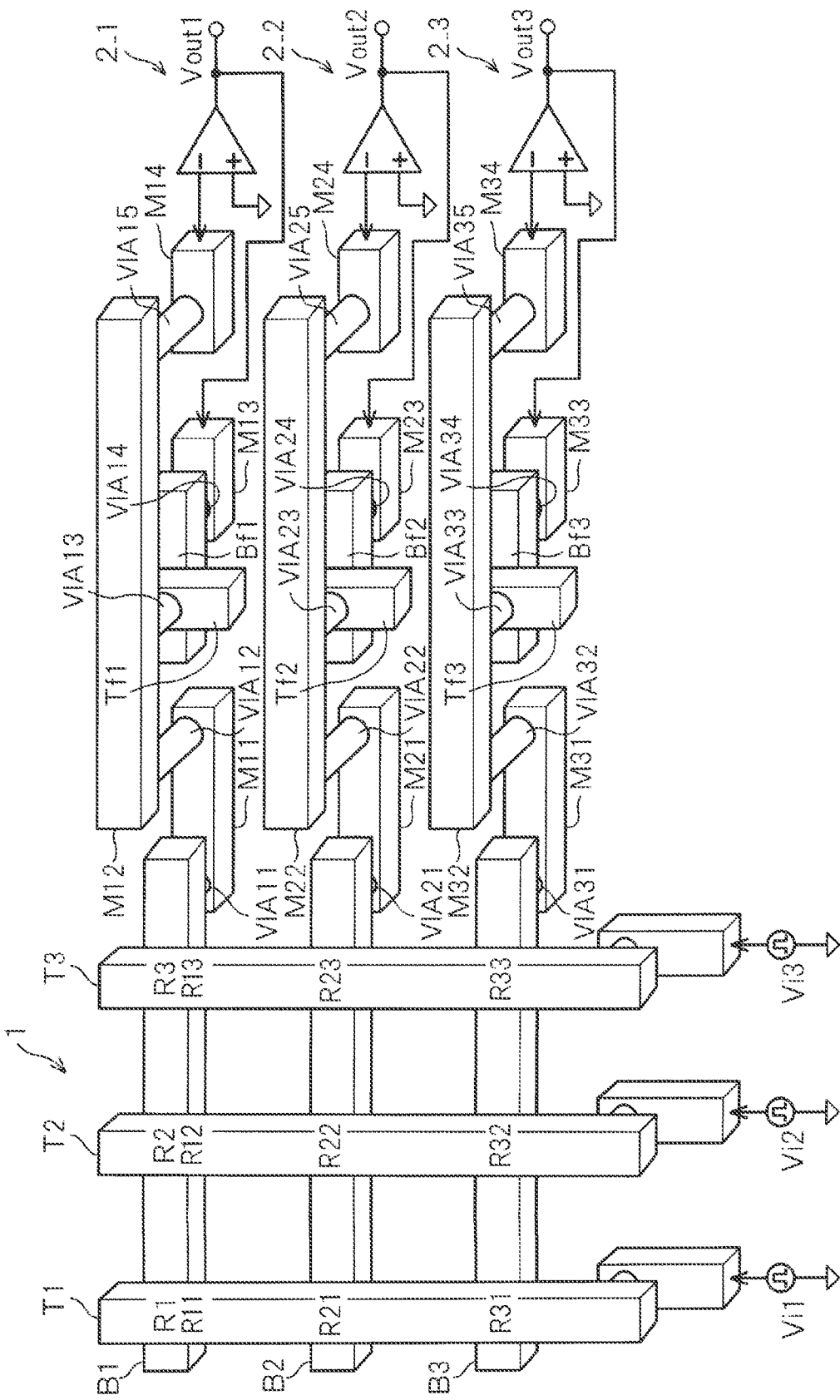
FIG. 10 is a diagram illustrating a wiring connection between a memory device and a feedback resistor in a fifth embodiment.

In contrast, the fifth embodiment has the structure illustrated in FIG. 10 for connecting the feedback resistors Rf of the sense amplifiers 2_1, 2_2, 2_3. The structure for connecting the feedback resistor Rf of the sense amplifiers 2_1 is as follows. The bottom electrode B1 of the memory elements R12, R12, R13 is connected to the output terminal Vout1 of the sense amplifiers 2_1 through a via VIA11, a metal wiring M11, a via VIA12, a metal wiring M12, a via VIA13, the top electrode Tf1 of the feedback resistor Rf, the bottom electrode Bf1 of the feedback resistor Rf, a via VIA14, and a metal wiring M13 in this order. The metal wiring M12 is connected to the inverting input terminal through a via VIA15 and a metal wiring M14 in this order. Structures for connecting the feedback resistors Rf of the sense amplifiers 2_2 and 2_3 1 are substantially the same as that illustrated above for connecting the feedback resistor Rf of the sense amplifier 2_1.

In this structure, the polarity direction of the feedback resistor Rf is aligned with those of the memory elements R, as in the first embodiment. This structure also includes one additional metal wiring layer above the top electrodes Tf1, Tf2, Tf3, as is the case of FIG. 11.

Sixth Embodiment

Figure 13:
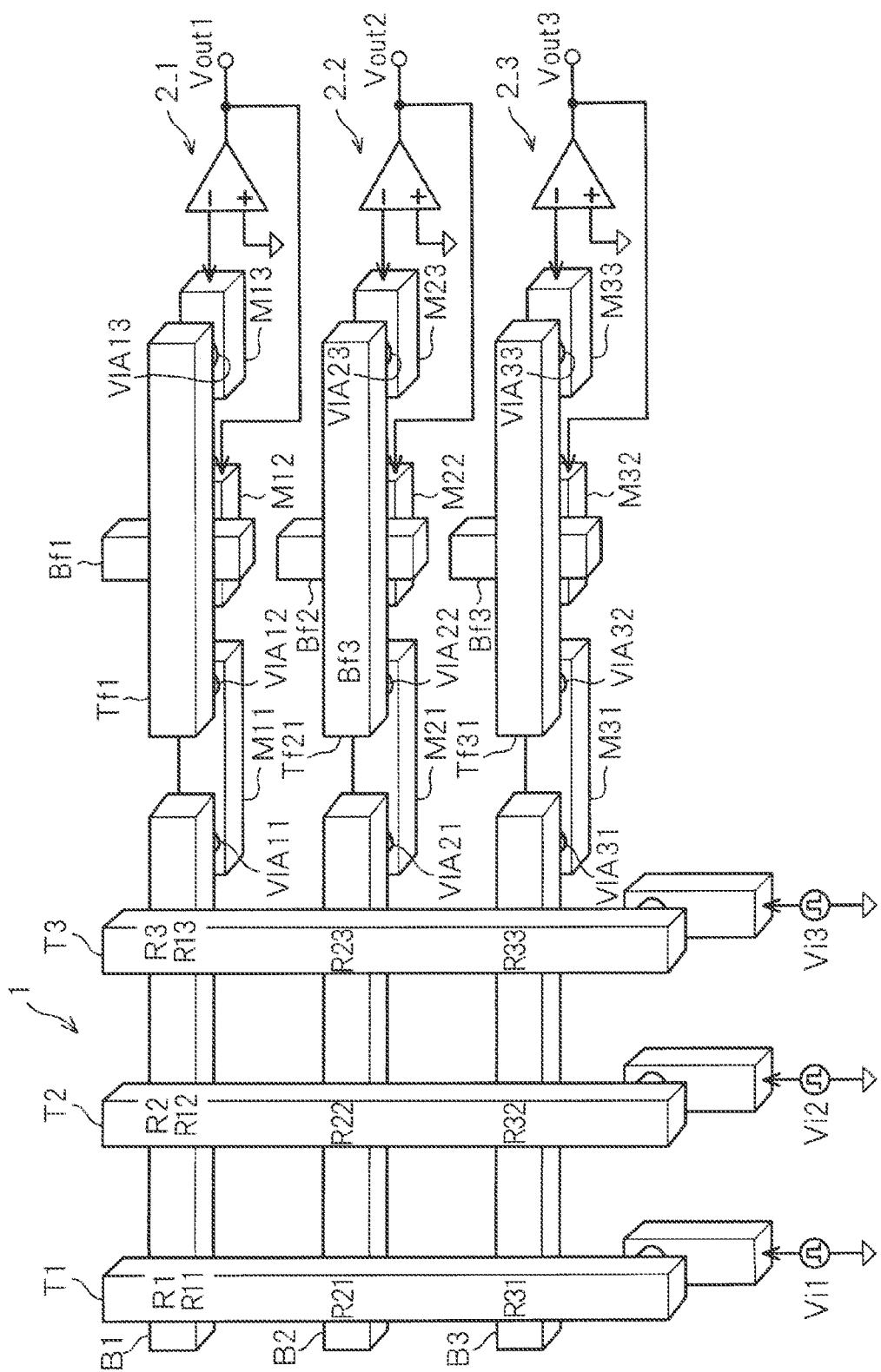
FIG. 13 is a diagram illustrating a wiring connection between a memory device and a feedback resistor in a sixth embodiment.

The sixth embodiment illustrated in FIG. 13 has an improved structure as compared with the fifth embodiment. Like the structure illustrated in FIG. 2, the sixth embodiment in FIG. 13 is arranged such that the top electrode Tf1 and the bottom electrode Bf1 of the feedback resistor Rf are crossed. The feedback resistor Rf in the sense amplifier 2_1 is connected in the following way. The bottom electrode B1 of the memory elements R1 to R3 are connected to the output terminal Vout1 through a via VIA11, a metal wiring M11, a via VIA12, the top electrode Tf1 of the feedback resistor Rf, the bottom electrode Bf1 of the feedback resistor Rf, and a metal wiring M12 in this order. The via VIA13 is connected to the inverting input terminal through a metal wiring M13. The feedback resistors Rf of the sense amplifier 2_2 and 2_3 are connected in substantially the same manner in which the feedback resistors Rf of the sense amplifier 2_1 is connected.

In the wiring arrangement of the sixth embodiments, the top electrodes T and the bottom electors B of the feedback resistors Rf are arranged in such a way that the top electrodes T and the bottom electors B of the feedback resistors Rf are rotated by 90 degrees with respect to the top electrodes T and the bottom electors B of the memory elements R in the memory device 1, as is the case in FIG. 2. Unlike the fifth embodiment, the sixth embodiment implements the wiring arrangement without adding a metal wiring layer above the top electrodes Tf1, Tf2, Tf3.

Seventh Embodiment

Figure 14:
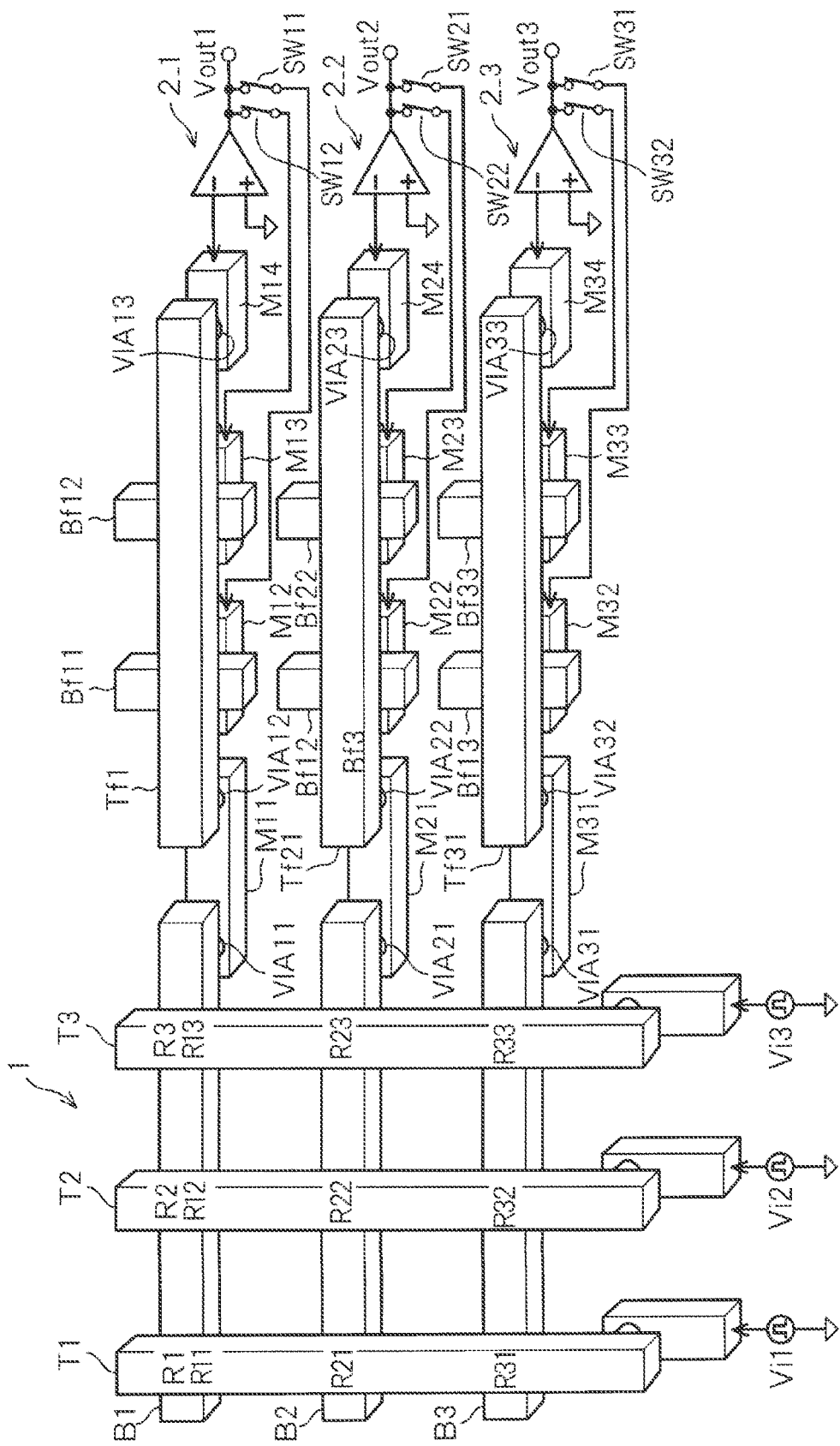
FIG. 14 is a diagram illustrating a wiring connection between a memory device and a feedback resistor a seventh embodiment.

The seventh embodiment shown in FIG. 14 has a specific wiring arrangement for the case where the feedback resistor Rf is a parallel circuit of the resistance elements Rf1 and Rf2 as in the fourth embodiment. In this case, a connection arrangement of the resistance elements Rf1 and Rf2 of the feedback resistor Rf in the sense amplifier 2_1 is as follows. The bottom electrode of the memory element R is connected to a top electrode Tf1 (common top electrode) of the resistance elements Rf1 and Rf2 through a via VIA1, a metal wiring M11, and a via VIA12 in this order. The top electrode Tf1 is connected to the output terminal of the sense amplifier 2_1 through a bottom electrode Bf11 of the resistance elements Rf1 of the e resistance element Rf1, a metal wiring M12, and a switch SW11 in this order. The top electrode Tf1 is also connected to the output terminal of the sense amplifier 2_1 through a bottom electrode Bf12 of the resistance element Rf2, a metal wiring M13 and a switch SW12 in this order. The via VIA13 is connected to the inverting input terminal through a metal wiring M14. Connection arrangements of the feedback resistors Rf in the sense amplifiers 2_2 and 2_3 may be substantially the same as that in the e sense amplifier 2_1.

Like sixth embodiment, the seventh embodiment can implement the wiring arrangement without adding a metal wiring layer above the top electrodes. Specifically, it is possible to form memristor layers after performing CMOS processes of forming the operational amplifier 3 and the like.

The switches SW11, SW12 are used to perform writing to the resistance elements Rf1 and Rf2 of the feedback resistor Rf to set different resistance values of the respective resistance elements Rf1 and Rf2 to desired values discussed in the fourth embodiment. Thus, although the switches SW11, SW12 are not shown in FIG. 8 illustrating the fourth embodiment, the fourth embodiment may include the switches SW11, SW12 for setting the resistance values of the respective resistance elements Rf1 and Rf2.

Other Embodiments

The above embodiments are combinable to form other embodiments. The above embodiments are provide for illustrative purpose and are not intended to limit the scope of the present disclosure. The above embodiments can be modified and extended in various ways including omitting, replacing and adding one or more elements.

Specifically, while the present disclosure has been described with reference to embodiments thereof, it is to be understood that the disclosure is to not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A neural network circuit comprising:
a memory device including memristors being variable resistance elements connected in a matrix, wherein the memristors serve as memory elements of the memory device;
a voltage application device arranged to apply a bias voltage to the memory device; and
a plurality of current-voltage (I-V) conversion amplification circuits arranged to convert currents flowing via the memory elements into voltages and output the voltages,
wherein:
a feedback resistor of each I-V conversion amplification circuit includes a memristor;
the feedback resistor of each I-V conversion amplification circuit and the memory elements acting as an input resistor of the I-V conversion amplification circuit are connected to align a polarity direction of the memristor of the feedback resistor and polarity directions of the memristors of the memory elements acting as the input resistor; and
at least one of the bias voltage or a reference voltage of the I-V conversion amplification circuit is provided with an offset voltage to match an operating polarity of the feedback resistor with an operating polarity of the memory elements acting as the input resistor.

2. The neural network circuit according to claim 1, wherein:
the feedback resistor has a parallel composite resistance of a first resistance and a second resistance that, respectively, correspond to a high resistance memristor and a low resistance memristor extracted from frequency distribution of resistance values set to respective memory elements of the memory device.

3. The neural network circuit according to claim 1, wherein:
the feedback resistor has an top electrode and a bottom electrode;
the top electrode of the feedback resistor is connected in a same direction as an electrode of the input resistor of a corresponding I-V conversion amplification circuit is connected; and
the top electrode and the bottom electrode of the feedback resistor are shaped to perpendicularly cross each other.

* * * * *